(12) United States Patent
Ji

(10) Patent No.: US 12,323,161 B2
(45) Date of Patent: Jun. 3, 2025

(54) ERROR CORRECTION CIRCUIT AND DATA TRANSMISSION METHOD

(71) Applicant: CHANGXIN MEMORY TECHNOLOGIES, INC., Hefei (CN)

(72) Inventor: Kangling Ji, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 175 days.

(21) Appl. No.: 18/151,432

(22) Filed: Jan. 7, 2023

(65) Prior Publication Data
US 2023/0283298 A1    Sep. 7, 2023

Related U.S. Application Data

(63) Continuation of application No. PCT/CN2022/095324, filed on May 26, 2022.

(30) Foreign Application Priority Data

Mar. 4, 2022  (CN) .......................... 202210209652.0

(51) Int. Cl.
*H03M 13/11*    (2006.01)
*H03M 13/00*    (2006.01)

(52) U.S. Cl.
CPC ...... *H03M 13/1111* (2013.01); *H03M 13/611* (2013.01)

(58) Field of Classification Search
CPC . H03M 13/1111; H03M 13/611; H03M 13/00
See application file for complete search history.

(56) References Cited

U.S. PATENT DOCUMENTS

| | | | |
|---|---|---|---|
| 7,640,480 B2 | 12/2009 | Barthel | |
| 9,411,683 B2 | 8/2016 | Kwok | |
| 11,855,656 B2 * | 12/2023 | Sun | H03M 13/19 |
| 11,978,525 B2 * | 5/2024 | Ning | G11C 29/42 |
| 11,983,416 B2 * | 5/2024 | Ning | G06F 3/0673 |
| 2005/0028067 A1 | 2/2005 | Weirauch | |
| 2006/0242535 A1 | 10/2006 | Barthel | |
| 2015/0188570 A1 | 7/2015 | Kwok | |

(Continued)

FOREIGN PATENT DOCUMENTS

| | | |
|---|---|---|
| CN | 1581339 A | 2/2005 |
| CN | 111752747 A | 10/2020 |

(Continued)

OTHER PUBLICATIONS

JP first office action in application No. 2023-537126, mailed on Jul. 23, 2024.

(Continued)

*Primary Examiner* — Justin R Knapp
(74) *Attorney, Agent, or Firm* — Syncoda LLC; Feng Ma

(57) ABSTRACT

A data error correction circuit includes: a data error correction circuit, configured to receive first data and a first check code corresponding to the first data, perform error correction on the first data according to the first check code to generate second data, and output the second data; and a check code generation circuit, configured to receive the first data and the first check code, generate a second check code according to the first data and the first check code, and output the second check code.

20 Claims, 9 Drawing Sheets

(56) References Cited

U.S. PATENT DOCUMENTS

2017/0123903 A1 5/2017 Eguchi
2020/0081782 A1 3/2020 Eichmeyer et al.

FOREIGN PATENT DOCUMENTS

JP S63240658 A 10/1988
JP 2007080343 A 3/2007

OTHER PUBLICATIONS

Extended European Search Report in Application No. 22839115.7, mailed on Dec. 21, 2023.
Po-Yuan Chen et al.: An Enhanced EDAC Methodology for Low Power PSRAM, International Test Conference, 2006, IEEE, PI.

* cited by examiner

ERROR CORRECTION CIRCUIT AND DATA TRANSMISSION METHOD

CROSS-REFERENCE TO RELATED APPLICATIONS

This application is a continuation of International Application No. PCT/CN2022/095324 filed on May 26, 2022, which claims priority to Chinese Patent Application No. 202210209652.0 filed on Mar. 4, 2022. The disclosures of the above-referenced applications are hereby incorporated by reference in their entirety.

BACKGROUND

The speed of a channel between a memory and a system (controller/processor) is increasingly faster, which brings a great challenge to the transmission accuracy of a signal. Under such circumstance, some implementations provides a link Error Correcting Code (Link ECC) in a data receiving terminal (controller/processor) to perform error correction on received data to correct an error that may be generated by channel transmission.

In order to improve the error correction accuracy, some implementations generally needs to generate, according to the received data and a first check code corresponding to the data, a second check code including a full check value of the data in the data receiving terminal, and then perform error correction on the data according to the second check code. The full check value is generated according to each bit of the data and each bit of the first check code. This sets a threshold for circuit functions of the data receiving terminal, and also increases the number of elements and the layout area of the data receiving terminal.

Therefore, how to reduce the requirement on the data receiving terminal without changing the error correction accuracy is a technical point which can be improved for an integrated circuit having a data transmission function.

It is to be noted that the information disclosed herein is only used to enhance the understanding of the background of the disclosure, and therefore may include the information that does not constitute the prior art well-known to persons skilled in the art.

SUMMARY

The disclosure relates to the technical field of integrated circuits, and in particular, to a data error correction circuit and a data transmission method for the data error correction circuit.

The disclosure is intended to provide a data error correction circuit and a data transmission method for the data error correction circuit, which are used for solving, at least to a certain extent, the problem in some implementations where a data error correction function requires many circuit elements and occupies large layout area.

According to a first aspect of the disclosure, provided is a data error correction circuit, provided in a memory, and including: a data error correction circuit, configured to receive first data and a first check code corresponding to the first data, perform error correction on the first data according to the first check code to generate second data, and output the second data; and a check code generation circuit, configured to receive the first data and the first check code, generate a second check code according to the first data and the first check code, and output the second check code.

According to a second aspect of the disclosure, provided is a data transmission method, executed by the memory of any one of the above, and including: acquiring first data to be transmitted and a first check code corresponding to the first data; performing error correction on the first data according to the first check code and the first data to generate second data; generating a second check code according to the first data and the first check code; and simultaneously outputting the second data and the second check code to a controller, to enable the controller to perform check and error correction on the second data according to the second check code.

It is to be understood that the above general description and the following detailed description are merely exemplary and explanatory, and are not intended to limit the disclosure.

BRIEF DESCRIPTION OF THE DRAWINGS

The accompanying drawings are incorporated in and constitute a part of the description, illustrate embodiments in line with the disclosure and, together with the description, serve to explain the principles of the disclosure. It is apparent that the accompanying drawings in the following description show only some embodiments of the disclosure, and persons skilled in the art may still derive other accompanying drawings from these accompanying drawings without creative efforts.

DETAILED DESCRIPTION

Figure 1:
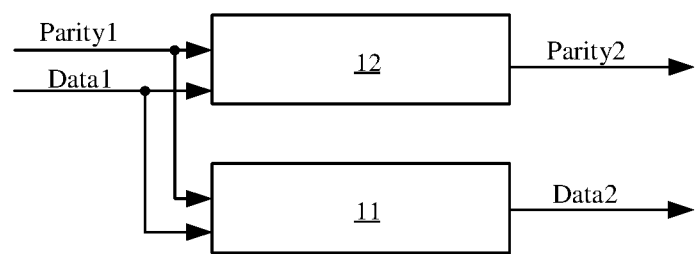
FIG. 1 is a schematic structural diagram of a data error correction circuit according to an exemplary embodiment of the disclosure.

Exemplary implementations are now described more comprehensively with reference to the accompanying drawings. However, the exemplary implementations may be implemented in many forms and should not be construed as limited to the examples set forth herein. Rather, the provision of such implementations makes the disclosure more thorough and complete, and may fully convey the concepts of the exemplary implementations to persons skilled in the art. The features, structures, or characteristics described may be combined in one or more implementations in any suitable manner. In the following description, numerous specific details are provided to give full understandings of the implementations of the disclosure. However, persons skilled in the art will appreciate that, technical solutions provided in the disclosure may be practiced but omitting one or more specific details, or by other methods, components, apparatus, operations, etc. In other cases, well-known technical solutions will not be shown or described in detail to avoid obscuring aspects of the disclosure.

In addition, the accompanying drawings are merely schematic illustrations of the disclosure. The same reference numerals in the accompanying drawings represent the same or similar elements, and thereby their description may not be repeated. Some of the block diagrams shown in the accompanying drawings are functional entities and do not necessarily correspond to physically or logically independent entities. Such functional entities may be implemented in the form of software, or implemented in one or more hardware circuits or integrated circuits, or implemented in different networks and/or processor apparatuses and/or micro-controller apparatuses.

The example implementations of the disclosure will be described in detail below with reference to the accompanying drawings.

FIG. 1 is a schematic structural diagram of a data error correction circuit according to an exemplary embodiment of the disclosure.

Referring to FIG. 1, the data error correction circuit 100 is provided in a memory, and may include:

a data error correction circuit 11, configured to receive first data Data1 and a first check code Parity1 corresponding to the first data, perform error correction on the first data Data1 according to the first check code Parity1 to generate second data Data2, and output the second data Data2; and a check code generation circuit 12, configured to receive the first data Data1 and the first check code Parity1, generate a second check code Parity2 according to the first data Data1 and the first check code Parity1, and output the second check code Parity2.

When the memory as a data sending terminal sends data to a data receiving terminal, before outputting the data, the memory performs error correction on an error in the data to be transmitted which may be caused by a memory array, that is, an On Die Error Correcting Code (On Die ECC) circuit is set to correct the error caused by the memory array.

In the embodiments of the disclosure, by improving the On Die ECC circuit of the memory, while error correction is performed on the first data Data1, the second check code Parity2 is directly generated according to the first data Data1 and the first check code Parity1 and then outputted, so that the data receiving terminal can directly perform, according to the second check code, check and error correction on the second data Data2 finally outputted by the memory, thereby reducing the tedious procedure in some implementations of generating a check code again in the data receiving terminal according to the received data and check code, reducing function requirements for the data receiving terminal, reducing the number of elements and the layout area of the data receiving terminal, and improving compatibility of the memory.

Figure 2:
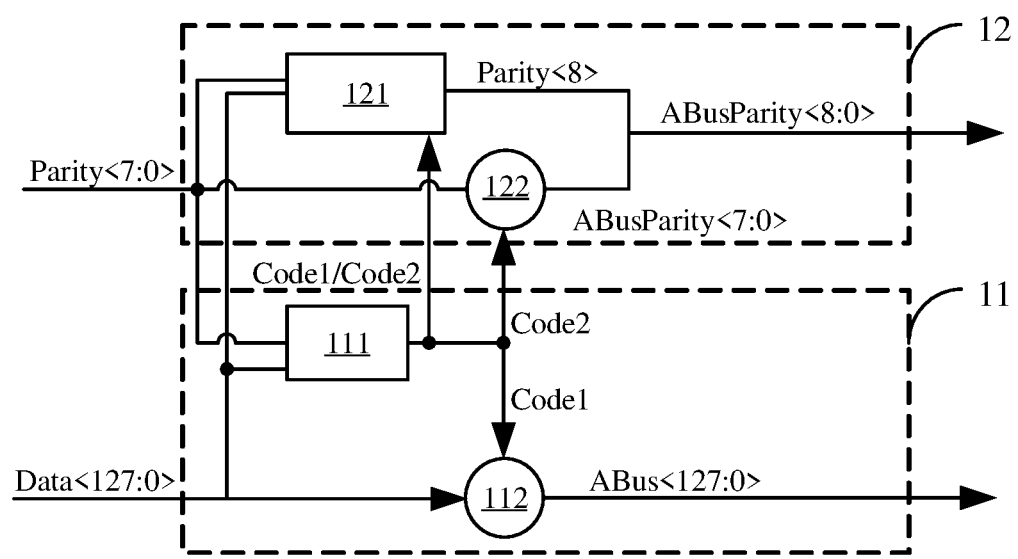
FIG. 2 is a schematic diagram of a data error correction circuit according to an embodiment of the disclosure.

FIG. 2 is a schematic diagram of a data error correction circuit according to an embodiment of the disclosure. In the embodiment shown in FIG. 2, it is assumed that the first data Data1 is 128 bits, and is denoted as Data<127:0>, and correspondingly, the first check code (an ECC check code of the first data) Parity1 is 8 bits, and is denoted as Parity<7:0>, the second data Data2 is 128 bits, and is denoted as ABus<127:0>, and the second check code Parity 2 includes a full check value of the second data Data2 which is 9 bits, and is denoted as ABusParity<8:0>.

Referring to FIG. 2, in one embodiment, the data error correction circuit 11 includes:

an error correction code generator 111, configured to receive the first data Data<127:0> and the first check code Parity<7:0> and generate a data error correction code Code1 or a check error correction code Code2 according to the first data Data<127:0> and the first check code Parity<7:0>; and a data error correction sub-circuit 112, connected to the error correction code generator 111, and configured to receive the first data Data<127:0> and the data error correction code Code1, and perform error correction on the first data Data<127:0> according to the data error correction code Code1 to generate and output the second data ABus<127:0>.

The check code generation circuit 12 is connected to the error correction code generator 111 and configured to receive the data error correction code Code1 and the check error correction code Code2, and the check code generation circuit 12 is configured to correct the second check code ABusParity<8:0> according to the data error correction code Code1 or the check error correction code Code2.

Exemplarily, in one embodiment, the check code generation circuit 12 includes:

a full check value generator 121, connected to the error correction code generator 111, and configured to receive the first data Data<127:0> and the first check code Parity<7:0>, and generate a full check value Parity<8> according to the first data Data<127:0>, the first check code Parity<7:0>, and the data error correction code Code1, or generate a full check value Parity<8> according to the first data Data<127:0>, the first check code Parity<7:0>, and the check error correction code Code2, where the second check code ABusParity<8:0> includes the full check value Parity<8>; and a check code error correction sub-circuit 122, connected to the error correction code generator 111, and configured to receive the first check code Parity<7:0>, and perform error correction on the first check code Parity<7:0> according to the check error correction code Code2 to output an error-corrected first check code ABusParity<7:0>, where the second check code ABusParity<8:0> includes the error-corrected first check code ABusParity<7:0>.

The full check value Parity<8> and the error-corrected first check code ABusParity<7:0> are outputted together to form the second check code ABusParity<8:0>. In one embodiment, a highest bit of the second check code ABusParity<8:0> is the full check value Parity<8>, and the error-corrected first check code Parity<7:0> forms remaining bits of the second check code ABusParity<8:0>. By setting the output timing of the full check value generator 121 and the check code error correction sub-circuit 122, the full check value generator 121 and the check code error correction sub-circuit 122 can together output the 9-bit second check code ABusParity<8:0>.

In the embodiments of the disclosure, the first check code is an ECC check code of the first data outputted by the memory. For generation of the ECC check code, XOR operation is performed on different bits in the first data according to a set rule, and an XOR result of multiple groups of different bits is set as one bit of the ECC check code. According to the generation rule of the ECC check code, whether there is an error in the data can be detected according to the ECC check code of the data, and error correction is performed on incorrect data bits by means of the ECC check code. The data is checked by using the ECC check code of the data, so that an error over an odd number of bits of the data may be detected.

The second check code of the data is generated according to the data and the first check code of the data. Several low bits of the second check code of the data are the first check code of the data, and a highest bit is the full check value of the data. The full check value is generated according to the data and the first check code of the data. In one embodiment, the full check value may be, for example, an XOR result of each bit of the data and each bit of the first check code. According to the rule, the data is checked by using the second check code of the data, so that whether the data has an error over an even number of bits can be detected.

By combining the first check code and the second check code of the data, comprehensive check and error correction can be performed on the data.

In the embodiment shown in FIG. 2, the error correction code generator 111 receives the first data and the first check code, and since the first check code is generated according to the first data, the error correction code generator 111 may check the first data and the first check code, and determine, according to check results, whether there is an error in the first data and the first check code. The error correction code generator 111 indicates the check results by outputting values of the two error correction codes. One error correction code is a data error correction code Code1 which is used to indicate that the first data has an error, and the other error correction code is a check error correction code Code2 which is used to indicate that the first check code has an error. It may be assumed that when the data error correction code Code1 is a first value, it is indicated that the first data has an error, and when the data error correction code Code1 is a second value, it is indicated that the first data is correct. The first value and the second value are, for example, a logic level 1 and a logic level 0 respectively, or the first value and the second value are respectively other values, which are not specifically limited in the disclosure. Similarly, it may be assumed that when the check error correction code Code2 is the first value, it is indicated that the first check code has an error, and when the check error correction code Code2 is the second value, it is indicated that the first check code is correct.

The data error correction sub-circuit 112 is configured to perform error correction on the first data. When the data error correction sub-circuit 112 receives the data error correction code Code1 indicating that the data has an error, the data error correction sub-circuit 112 performs error correction on the first data according to the data error correction code Code1 to output second data. When the data error correction sub-circuit 112 receives the data error correction code Code1 indicating that the data is correct, the data error correction sub-circuit 112 does not perform error correction on the first data according to the data error correction code Code1, and directly outputs the first data as second data.

Similarly, the check error correction sub-circuit 122 is configured to perform error correction on the first check code. When the check error correction sub-circuit 122 receives the check error correction code Code2 indicating that the first check code has an error, the check error correction sub-circuit 122 performs error correction on the first check code according to the check error correction code Code2 to output an error-corrected first check code. When the check error correction sub-circuit 122 receives the check error correction code Code2 indicating that the first check code is correct, the check error correction sub-circuit 122 does not perform error correction on the first check code according to the check error correction code Code2, and directly outputs the first check code as an error-corrected first check code.

The check code generation circuit 12 needs to generate a second check code related to the first data and the first check code. Regardless of whether the first data or the first check code has an error, correctness of the full check value can be affected. The check code generation circuit 12 receives the data error correction code Code1 and the check error correction code Code2.

The full check value generator 121 is configured to generate a full check value of the first data. Regardless of whether the first data or the first check code has an error, correctness of the full check value can be affected. The full check value generator 121 simultaneously receives the data error correction code Code1 and the check error correction code Code2.

The check code error correction sub-circuit 122 performs error correction only on the first check code, and therefore, receives the check error correction code Code2, performs error correction on the first check code according to an indication of the check error correction code Code2, and outputs an error-corrected first check code ABusParity<7:0> (also 8 bits).

In the embodiments of the disclosure, the first data is error-corrected to generate the second data, and the full check value is also corrected according to whether the first data is correct, so as to correct the second check code, thereby ensuring the accuracy of the second check code. In addition, in the embodiments of the disclosure, the first check code is further checked, and when the first check code has an error, error correction is performed on the first check code and the full check value, thereby further ensuring the accuracy of the second check code.

Therefore, the embodiments of the disclosure can improve the accuracy of the second check code. Moreover, due to the use of the existing On Die ECC circuit of the memory, the circuit structure and the signal connection do not increase a large burden. Compared with the fact in some implementations that a generation circuit of a second check code needs to be set in each data receiving terminal connected to a memory, the embodiments of the disclosure can greatly save the total number of circuit elements and the layout area of the memory and each data receiving terminal.

Figure 3:
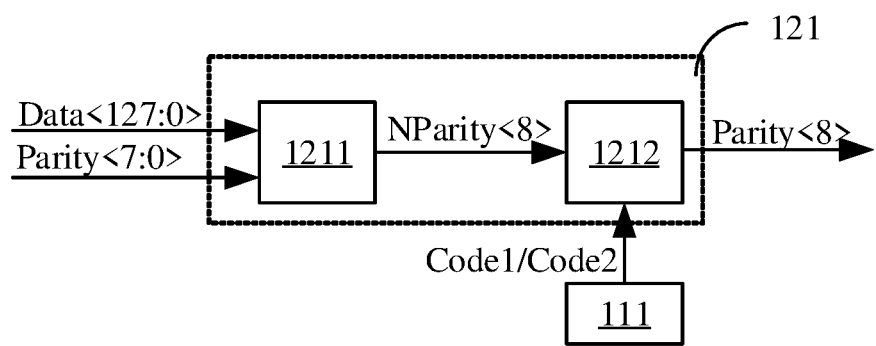
FIG. 3 is a schematic diagram of a full check value generator 121 shown in FIG. 2 according to an embodiment of the disclosure.

FIG. 3 is a schematic diagram of a full check value generator 121 shown in FIG. 2 according to an embodiment of the disclosure.

Referring to FIG. 3, in one embodiment, the full check value generator 121 may include:

a full check value calculator 1211, configured to receive the first data Data<127:0> and the first check code Parity<7:0>, and generate an initial full check value Nparity<8> according to the first data Data<127:0> and the first check code Parity<7:0>; and a full check value error correction sub-circuit 1212, connected to the full check value Parity<8> calculator and the error correction code generator 111, and configured to perform error correction on the initial full check value Nparity<8> according to the data error correction code Code1 or the check code error correction code Code2, and output the full check value Parity<8>.

The initial full check value Nparity<8> may be obtained, for example, by performing XOR operation on each bit of the first data Data<127:0> and each bit of the first check code Parity<7:0>.

In one embodiment, the full check value error correction sub-circuit 1212 is configured to, after receiving the data error correction code Code1 and the check error correction code Code2, invert the initial full check value Nparity<8> to generate the full check value Parity<8>.

The working logic of the data error correction circuit corresponding to the embodiment shown in FIG. 3 is, for example, described as below.

If the error correction code generator 111 determines that the first data Data<127:0> and the first check code Parity<7:0> do not have an error, the error correction code generator 111 outputs values of Code1 and Code2 indicating that the data and the check code are correct, and the check code error correction sub-circuit 122 does not perform error correction on the first check code Parity<7:0> and directly outputs the first check code as an error-corrected first check code ABusParity<7:0> (i.e., low 8 bits of the second check code). After receiving the values of the data error correction code Code1 and the check error correction code Code2 indicating that the data and the check code are correct, the full check value error correction sub-circuit 1212 does not perform error correction on the full check value, and directly outputs the initial full check value NParity<8> calculated by the full check value calculator 1211 as the full check code Parity<8>. The error-corrected first check code ABusParity<7:0> and the Parity<8> constitute the second check code ABusParity<8:0>. The data error correction sub-circuit 112 directly outputs the first data Data<127:0> as the second data Abus<127:0>. The sending timing of the data error correction circuit 11 and the check code generation circuit 12 is controlled, so that the second check code ABusParity<8:0> and the second data ABus<127:0> are sent through an output port.

If the error correction code generator 111 determines that the first data Data<127:0> has an error, the check code error correction sub-circuit 122 receives the check error correction code Code2 indicating that the first check code is correct, and does not perform error correction on the first check code Parity<7:0> and directly outputs the first check code Parity<7:0> as an error-corrected first check code ABusParity<7:0> (i.e., low 8 bits of the second check code). The full check value error correction sub-circuit 1212 inverts, according to the data error correction code Code1 indicating that the data has an error, the initial full check value NParity<8> calculated by the full check value calculator 1211 and then outputs same as the Parity<8> (i.e., a highest bit of the second check code). The error-corrected first check code ABusParity<7:0> and the Parity<8> constitute the second check code ABusParity<8:0>. The data error correction sub-circuit 112 performs error correction on the first data Data<127:0> according to the data error correction code Code1 indicating that the data has an error, and then outputs the second data Abus<127:0>. The sending timing of the data error correction circuit 11 and the check code generation circuit 12 is controlled, so that the second check code ABusParity<8:0> and the second data ABus<127:0> are simultaneously sent through the output port.

If the error correction code generator 111 determines that the first check code Parity<7:0> has an error, the check code error correction sub-circuit 122 receives the check error correction code Code2 indicating that the first check code is correct, and performs error correction on the first check code Parity<7:0> and then outputs an error-corrected first check code ABusParity<7:0> (i.e., low 8 bits of the second check code). The full check value error correction sub-circuit 1212 inverts, according to the check error correction code Code2 indicating that the first check code is correct, the initial full check value NParity<8> calculated by the full check value calculator 1211 and then outputs same as the Parity<8> (i.e., the highest bit of the second check code). The error-corrected first check code ABusParity<7:0> and the Parity<8> constitute the second check code ABusParity<8:0>. The data error correction sub-circuit 112 does not perform error correction on the first data Data<127:0> according to the data error correction code Code1 indicating that the data is correct, and directly outputs the first data as the second data Abus<127:0>. The sending timing of the data error correction circuit 11 and the check code generation circuit 12 is controlled, so that the second check code ABusParity<8:0> and the second data ABus<127:0> are simultaneously sent through the output port.

Figure 4:
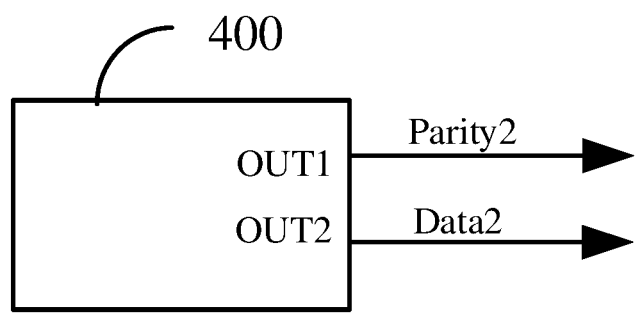
FIG. 4 is a schematic diagram of a memory according to an embodiment of the disclosure.

FIG. 4 is a schematic diagram of a memory according to an embodiment of the disclosure.

Referring to FIG. 4, the memory 400 may include:
- a data error correction circuit according to the above embodiments;
- a first output terminal OUT1, configured to output second data Data2; and
- a second output terminal OUT2, configured to output a second check code Parity2 corresponding to the second data Data2.

The memory shown in FIG. 4 has the function of directly outputting a second check code including a full check code of the second data. There is no need to additionally provide a full check code generation circuit in a data receiving terminal, and the data receiving terminal is allowed to directly perform check and error correction on the second data according to the second check code, thereby greatly reducing the technical requirements and power consumption of the data receiving terminal. When multiple data receiving terminals are connected, the area and power consumption of the whole circuit are greatly reduced.

Figure 5:
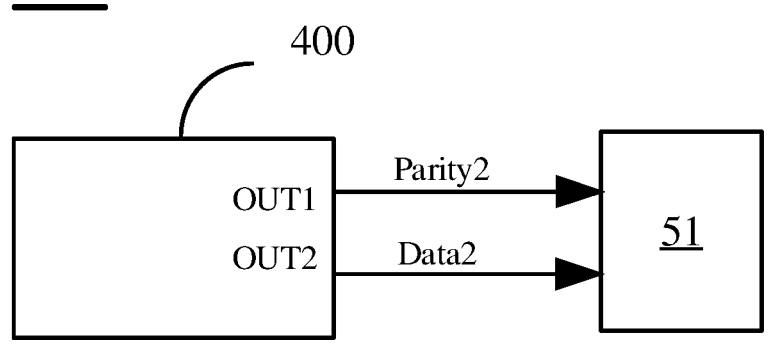
FIG. 5 is a schematic diagram of an integrated memory apparatus using the memory shown in FIG. 4.

FIG. 5 is a schematic diagram of an integrated memory apparatus using the memory shown in FIG. 4.

Referring to FIG. 5, the integrated memory apparatus 500 may include:
- the memory 400; and
- a controller 51, connected to the memory 400, and configured to receive second data Data2 and a second check code Parity2, and perform check and error correction on the second data Data2 according to the second check code Parity2.

In one embodiment, the controller 51 may determine, according to the second check code Parity2, whether there is a multi-bit error in the second data Data2.

In the integrated memory apparatus shown in FIG. 5, there is no need to provide a full check value generation circuit in the controller 51, and the controller 51 may directly perform check and error correction on the second data according to the second check value including the full check value. Thus, the controller 51 has a smaller circuit area and lower power consumption.

Figure 6:
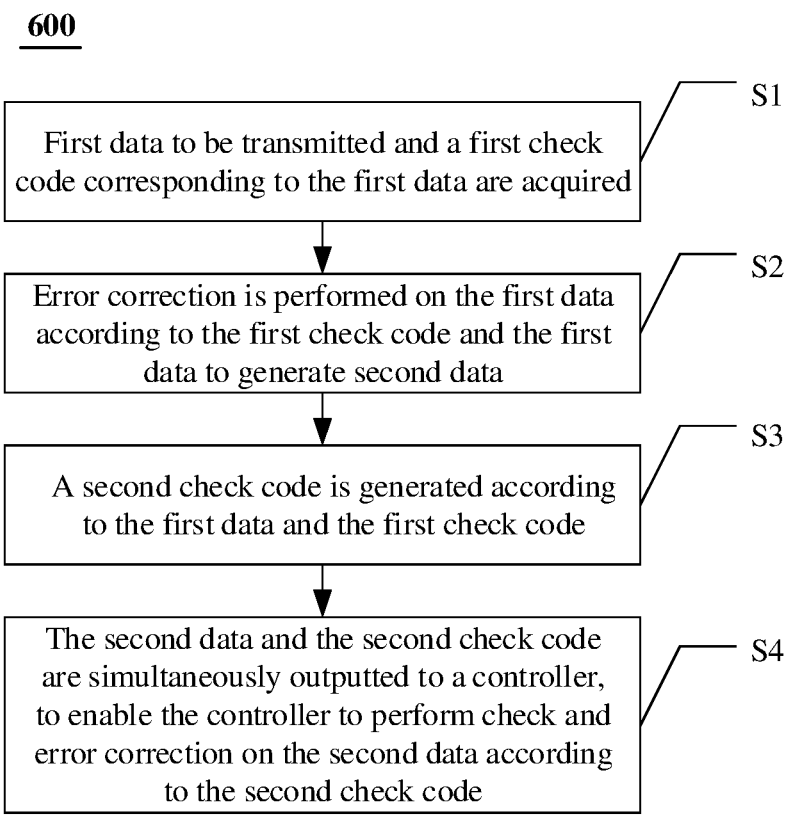
FIG. 6 is a flowchart of a data transmission method according to an embodiment of the disclosure.

FIG. 6 is a flowchart of a data transmission method according to an embodiment of the disclosure. The method shown in FIG. 6 may be performed by the memory 400 shown in FIG. 5.

Referring to FIG. 6, the data transmission method 600 may include following operations S1 to S4.

In S1, first data to be transmitted and a first check code corresponding to the first data are acquired.

In S2, error correction is performed on the first data according to the first check code and the first data to generate second data.

In S3, a second check code is generated according to the first data and the first check code.

In S4, the second data and the second check code are simultaneously outputted to a controller, to enable the controller to perform check and error correction on the second data according to the second check code.

In conjunction with FIG. 1 and FIG. 2, operation S1 shown in FIG. 6 may be performed jointly by the data error correction circuit 11 and the check code generation circuit 12, operation S2 is performed by the data error correction circuit 11, operation S3 is performed by the check code generation circuit 12, and operation S4 is performed jointly by the data error correction circuit 11 and the check code generation circuit 12.

The first check code corresponding to the first data is, for example, an ECC check code, and the second check code is formed according to the first data and the ECC check code. The second check code is generated directly according to the first data and the first check code on the memory, so that the data receiving terminal may directly perform error correction on the second data according to the second check code, thereby saving the number of circuit elements and the layout area of the data receiving terminal, and improving the compatibility of the memory.

Figure 7:
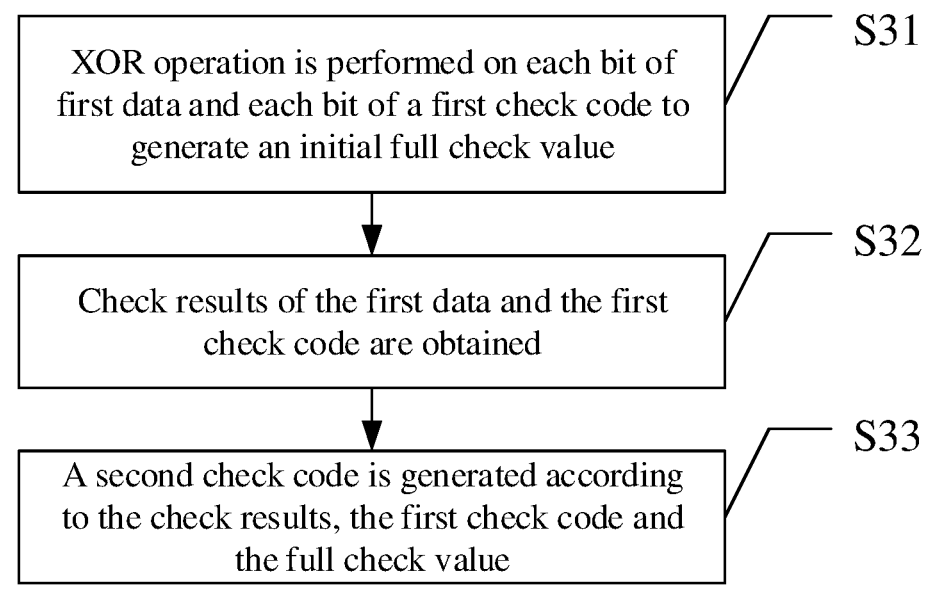
FIG. 7 is a sub-flowchart of operation S3 according to an embodiment of the disclosure.

FIG. 7 is a sub-flowchart of operation S3 according to an embodiment of the disclosure.

Referring to FIG. 7, in one embodiment, operation S3 may include operations S31 to S33.

In S31, XOR operation is performed on each bit of the first data and each bit of the first check code to generate an initial full check value.

In S32, check results of the first data and the first check code are acquired.

In S33, the second check code is generated according to the check results, the first check code and the full check value.

The embodiment shown in FIG. 7 may be performed by the circuit shown in FIG. 3. Operation S31 may be performed by the full check value calculator 1211, and operation S32 and operation S33 may be performed by the full check value error correction sub-circuit 1212.

Figure 8:
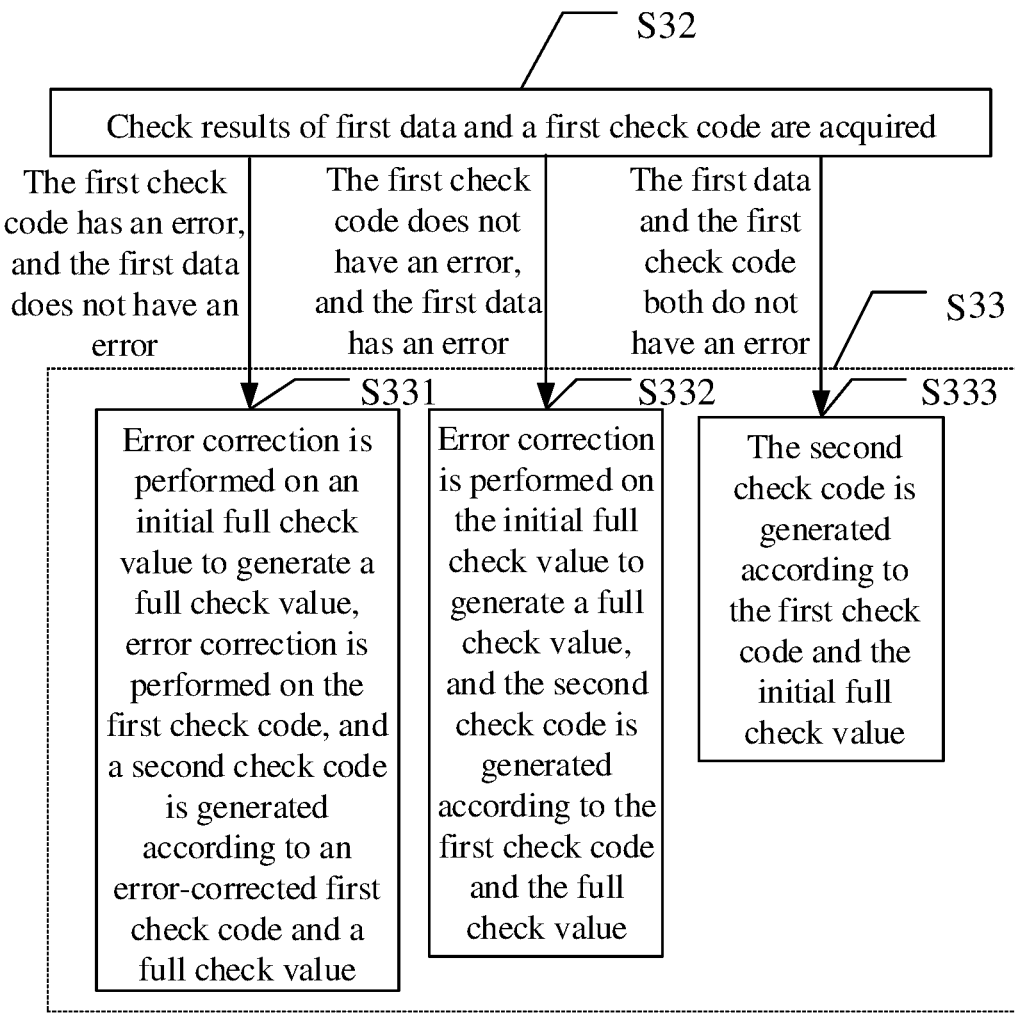
FIG. 8 is a sub-flowchart of operation S33 shown in FIG. 7 according to an embodiment of the disclosure.

FIG. 8 is a sub-flowchart of operation S33 shown in FIG. 7 according to an embodiment of the disclosure.

Referring to FIG. 7, in one embodiment, operation S33 may include operations S331 to S333.

In S331, when it is determined, according to the check results, that the first check code has an error and the first data does not have an error, error correction is performed on the initial full check value to generate a full check value, error correction is performed on the first check code, and the second check code is generated according to an error-corrected first check code and the full check value.

In S332, when it is determined, according to the check results, that the first check code does not have an error and the first data has an error, error correction is performed on the initial full check value to generate a full check value, and the second check code is generated according to the first check code and the full check value.

In S333, when it is determined, according to the check results, that the first data and the first check code both do not have an error, the second check code is generated according to the first check code and the initial full check value.

The performing error correction on the initial full check value to generate the full check value includes: inverting the initial full check value to generate the full check value.

In the embodiments shown in FIG. 2 and FIG. 3, the method shown in FIG. 7 may be described as follows.

If the first data Data<127:0> and the first check code Parity<7:0> do not have an error, the first check code Parity<7:0> is taken as the ABusParity<7:0> (i.e., low 8 bits of the second check code), and the calculated initial full check value NParity<8> is taken as the full check code Parity<8>. The ABusParity<7:0> and the Parity<8> constitute the second check code ABusParity<8:0>. The first data Data<127:0> is sent directly as the second data Abus<127:0>, and the second check code ABusParity<8:0> and the second data ABus<127:0> are simultaneously sent through the output port.

If the first data Data<127:0> has an error, the first check code Parity<7:0> is taken as the ABusParity<7:0> (i.e., low 8 bits of the second check code), and the calculated initial full check value NParity<8> is inverted to act as the full check code Parity<8>. The ABusParity<7:0> and the Parity<8> constitute the second check code ABusParity<8:0>. After error correction is performed on the first data Data<127:0>, the second data Abus<127:0> is sent, and then the second check code ABusParity<8:0> and the second data ABus<127:0> are sent through the output port.

If the first check code Parity<7:0> has an error, the first check code Parity<7:0> is error-corrected by the full check value error correction sub-circuit 1212 to act as the ABusParity<7:0> (i.e., low 8 bits of the second check code), and the calculated initial full check value NParity<8> is inverted to act as the full check code Parity<8>. The ABusParity<7:0> and the Parity<8> constitute the second check code ABusParity<8:0>. The first data Data<127:0> is sent directly as the second data Abus<127:0>, and then the second check code ABusParity<8:0> and the second data ABus<127:0> are sent through the output port.

In addition to generating the full check value, and then directly performing error correction on the full check value according to the data error correction code and the check error correction code, error correction can be performed first, and then the full check value is generated according to correct data after error correction.

Figure 9:
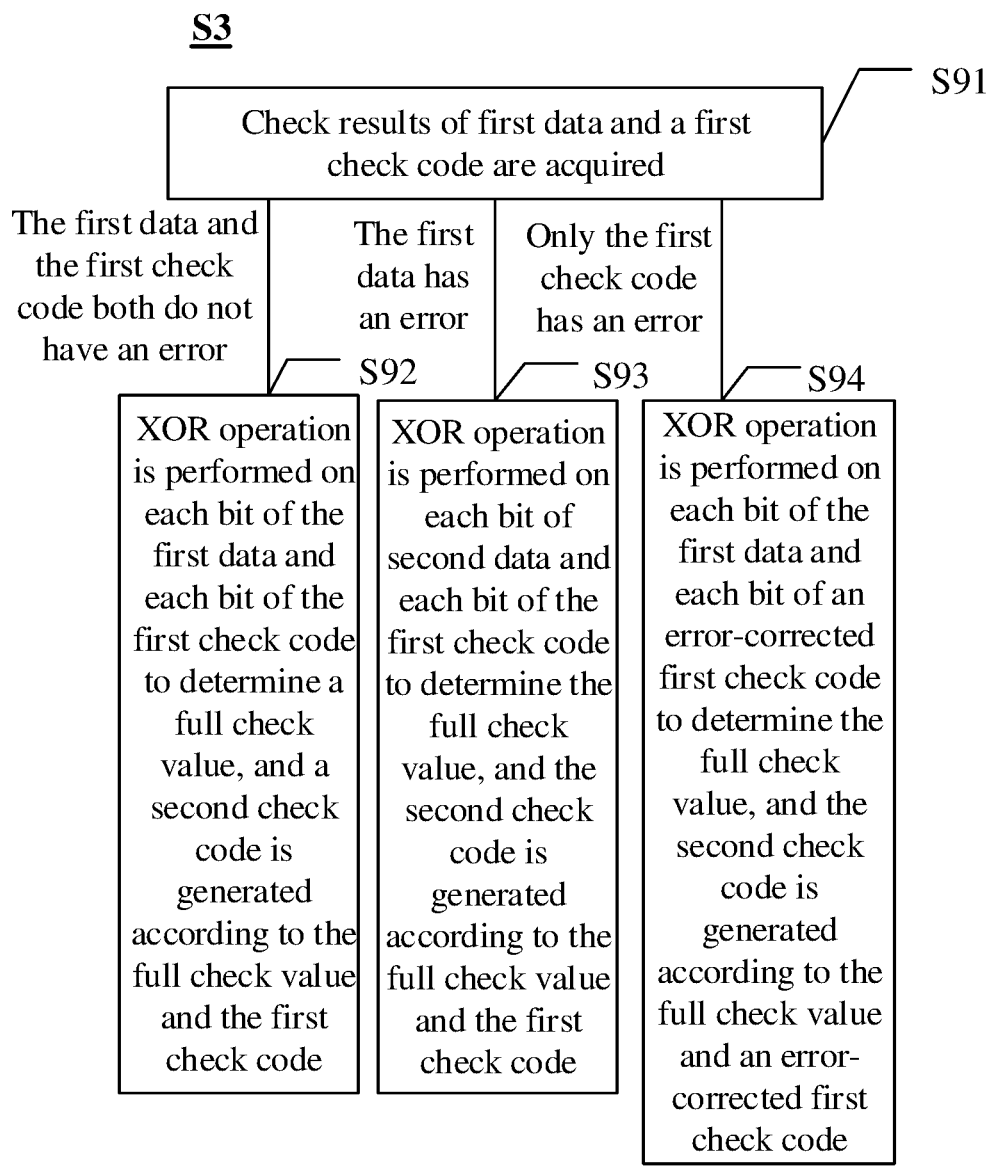
FIG. 9 is a sub-flowchart of operation S3 according to another embodiment of the disclosure.

FIG. 9 is a sub-flowchart of operation S3 according to another embodiment of the disclosure.

Referring to FIG. 9, in another embodiment, operation S3 may include operations S91 to S94.

In S91, check results of the first data and the first check code are acquired.

In S92, when it is determined, according to the check results, that the first data and the first check code both do not have an error, XOR operation is performed on each bit of the first data and each bit of the first check code to determine a full check value, and the second check code is generated according to the full check value and the first check code.

In S93, when it is determined, according to the check results, that only the first data has an error, XOR operation is performed on each bit of the second data and each bit of the first check code to determine a full check value; and the second check code is generated according to the full check value and the first check code.

In S94, when it is determined, according to the check results, that only the first check code has an error, XOR operation is performed on each bit of the first data and each bit of an error-corrected first check code to determine a full check value, and the second check code is generated according to the full check value and the error-corrected first check code.

The embodiment shown in FIG. 9 may be applied to a situation where the first check code is another type of check code which is a non-ECC check code, which has a more accurate processing result.

In the embodiment shown in FIG. 9, if only the first data has an error, then the full check value is generated directly using second data after error correction, which requires that the error correction to the first data is completed before generating the second check value. If only the first check code has an error, the first check code needs to be error-corrected first, and then the full check value is generated, which requires that the error correction to the first check code is completed before generating the full check value. When the first check code is an ECC check code, the embodiment shown in FIG. 7 can more quickly generate the full check value compared with the embodiment shown in FIG. 9. Moreover, according to the generation principle of the ECC check code, the full check value is corrected by the simple action of inversion, without waiting for error correction on the first data and the first check value. The error correction can be performed in parallel with the process of generating the full check value, and the data processing speed is faster.

In conclusion, according to the data processing method provided by the embodiments of the disclosure, while error correction is performed on the first data, the second check code is directly generated according to the first data and the first check code and then outputted, so that the data receiving terminal can directly perform, according to the second check code, check and error correction on the second data finally outputted by the memory, thereby reducing function requirements for the data receiving terminal, reducing the number of elements and the layout area of the data receiving terminal, and improving compatibility of the memory.

Persons skilled in the art can easily figure out other implementation solutions of the disclosure after considering the description and practicing the invention disclosed here. This application is intended to cover any variations, functions, or adaptive changes of the disclosure. These variations, functions, or adaptive changes comply with general principles of the disclosure, and include common general knowledge or common technical means in the technical field that are not disclosed in the disclosure. The description and embodiments are merely considered to be exemplary, and the actual scope and concept of the disclosure are pointed out in the claims.

In the embodiments of the disclosure, generation of the second check code is completed in the data error correction circuit of the memory, and the second data after error correction and the second check code corresponding to the second data are directly outputted, so that a data receiving terminal can directly perform check and error correction on the second data according to the second check code, thereby reducing the tedious procedure in some implementations of generating a check code again in the data receiving terminal according to the received data and check code, reducing function requirements for the data receiving terminal, reducing the number of elements and the layout area of the data receiving terminal, and improving compatibility of the memory.

What is claimed is:

1. An error correction circuit, provided in a memory, the error correction circuit comprising:
a data error correction circuit, configured to receive first data and a first check code corresponding to the first data, perform error correction on the first data according to the first check code to generate second data, and output the second data; and
a check code generation circuit, configured to receive the first data and the first check code, generate a second check code according to the first data and the first check code, and output the second check code.

2. The error correction circuit of claim 1, wherein the data error correction circuit comprises:

an error correction code generator, configured to receive the first data and the first check code and generate a data error correction code and a check error correction code according to the first data and the first check code; and
a data error correction sub-circuit, connected to the error correction code generator, and configured to receive the first data and the data error correction code, and perform error correction on the first data according to the data error correction code to generate and output the second data.

3. The error correction circuit of claim 2, wherein the check code generation circuit is connected to the error correction code generator and configured to receive the data error correction code and the check error correction code, and the check code generation circuit is configured to correct the second check code according to the data error correction code or the check error correction code.

4. The error correction circuit of claim 2, wherein the check code generation circuit comprises:
a full check value generator, connected to the error correction code generator, and configured to receive the first data and the first check code, and generate a full check value according to the first data, the first check code and the data error correction code, or generate the full check value according to the first data, the first check code and the check error correction code, wherein the second check code comprises the full check value.

5. The error correction circuit of claim 4, wherein the full check value generator comprises:
a full check value calculator, configured to receive the first data and the first check code, and generate an initial full check value according to the first data and the first check code; and
a full check value error correction sub-circuit, connected to the full check value calculator and the error correction code generator, and configured to perform error correction on the initial full check value according to the data error correction code or the check code error correction code, and output the full check value.

6. The error correction circuit of claim 5, wherein the full check value error correction sub-circuit is configured to, after receiving the data error correction code or the check error correction code, invert the initial full check value to generate the full check value.

7. The error correction circuit of claim 5, wherein the initial full check value is obtained by performing XOR operation on each bit of the first data and each bit of the first check code.

8. The error correction circuit of claim 4, wherein the check code generation circuit comprises:
a check code error correction sub-circuit, connected to the error correction code generator, and configured to receive the first check code, and perform error correction on the first check code according to the check error correction code, wherein the second check code comprises an error-corrected first check code.

9. The error correction circuit of claim 8, wherein a highest bit of the second check code is the full check value, and the error-corrected first check code forms remaining bits of the second check code.

10. The error correction circuit of claim 8, wherein the first check code comprises 8-bit data.

11. A memory comprising the error correction circuit of claim 1, wherein the memory further comprises:

a first output terminal, configured to output the second data; and a second output terminal, configured to output the second check code corresponding to the second data.

12. An integrated memory apparatus comprising the memory according to claim 11, wherein the integrated memory apparatus further comprises:

a controller, connected to the memory, and configured to receive the second data and the second check code, and perform check and error correction on the second data according to the second check code.

13. The integrated memory apparatus of claim 12, wherein the controller determines, according to the second check code, whether there is a multi-bit error in the second data.

14. A data transmission method, executed by a memory, comprising:

acquiring first data to be transmitted and a first check code corresponding to the first data;

performing error correction on the first data according to the first check code and the first data to generate second data;

generating a second check code according to the first data and the first check code; and simultaneously outputting the second data and the second check code to a controller, to enable the controller to perform check and error correction on the second data according to the second check code.

15. The data transmission method of claim 14, wherein generating the second check code according to the first data and the first check code comprises:

performing XOR operation on each bit of the first data and each bit of the first check code to generate an initial full check value;

acquiring check results generated by checking the first data and the first check code, wherein the check results are used to determine if there are any errors in the first data and the first check code; and generating the second check code according to the check results, the first check code and the full check value.

16. The data transmission method of claim 15, wherein generating the second check code according to the check results, the first check code and the full check value comprises:

when it is determined, according to the check results, that the first check code has an error and the first data does not have an error, performing error correction on the initial full check value to generate a full check value, and performing error correction on the first check code; and generating the second check code according to an error-corrected first check code and the full check value.

17. The data transmission method of claim 15, wherein generating the second check code according to the check results, the first check code and the full check value comprises:

when it is determined, according to the check results, that the first check code does not have an error and the first data has an error, performing error correction on the initial full check value to generate a full check value; and generating the second check code according to the first check code and the full check value.

18. The data transmission method of claim 15, wherein generating the second check code according to the check results, the first check code and the full check value comprises:

when it is determined, according to the check results, that the first data and the first check code both do not have an error, generating the second check code according to the first check code and the initial full check value.

19. The data transmission method of claim 16, wherein performing error correction on the initial full check value to generate the full check value comprises:

inverting the initial full check value to generate the full check value.

20. The data transmission method of claim 14, wherein generating the second check code according to the first data and the first check code comprises:

acquiring check results of the first data and the first check code; and when it is determined, according to the check results, that the first data and the first check code both do not have an error, performing XOR operation on each bit of the first data and each bit of the first check code to determine a full check value, and generating the second check code according to the full check value and the first check code;

when it is determined, according to the check results, that only the first data has an error, performing XOR operation on each bit of the second data and each bit of the first check code to determine a full check value, and generating the second check code according to the full check value and the first check code; and when it is determined, according to the check results, that only the first check code has an error, performing XOR operation on each bit of the first data and each bit of an error-corrected first check code to determine a full check value, and generating the second check code according to the full check value and the error-corrected first check code.

* * * * *